(12) United States Patent
Anderle et al.

(10) Patent No.: US 11,542,754 B2
(45) Date of Patent: *Jan. 3, 2023

(54) CUTTING STRUCTURE DESIGN WITH SECONDARY CUTTER METHODOLOGY

(71) Applicant: Halliburton Energy Services, Inc., Houston, TX (US)

(72) Inventors: Seth Garrett Anderle, Spring, TX (US); Robert W. Arfele, Magnolia, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 953 days.

This patent is subject to a terminal disclaimer.

(21) Appl. No.: 16/254,236

(22) Filed: Jan. 22, 2019

(65) Prior Publication Data

US 2019/0195024 A1 Jun. 27, 2019

Related U.S. Application Data

(62) Division of application No. 15/037,273, filed as application No. PCT/US2013/076091 on Dec. 18, 2013, now Pat. No. 10,920,496.

(51) Int. Cl.
*E21B 10/43* (2006.01)
*B24D 99/00* (2010.01)
*G06F 30/17* (2020.01)

(52) U.S. Cl.
CPC ............ *E21B 10/43* (2013.01); *B24D 99/005* (2013.01); *E21B 2200/20* (2020.05); *G06F 30/17* (2020.01)

(58) Field of Classification Search
CPC ....... E21B 10/43; E21B 2200/20; G06F 30/17
USPC ............................................................. 703/7
See application file for complete search history.

(56) References Cited

U.S. PATENT DOCUMENTS

| 4,889,017 | A | * | 12/1989 | Fuller | E21B 10/567 175/428 |
| 5,531,281 | A | * | 7/1996 | Murdock | E21B 10/43 175/431 |
| 5,549,171 | A | * | 8/1996 | Mensa-Wilmot | E21B 10/43 175/431 |
| 5,551,522 | A | * | 9/1996 | Keith | E21B 10/55 175/420.2 |

(Continued)

FOREIGN PATENT DOCUMENTS

| CN | 2451714 | 10/2001 |
| CN | 101048570 | 10/2007 |

(Continued)

OTHER PUBLICATIONS

Sinor at al. (Drag Bit Wear Model, Society of Petroleum Engineers, 1989, pp. 128-136) (Year: 1989).*

(Continued)

*Primary Examiner* — Iftekhar A Khan
(74) *Attorney, Agent, or Firm* — Thomas Rooney; C. Tumey Law Group PLLC

(57) ABSTRACT

A drill bit for subterranean drilling operations is disclosed. The drill bit comprises a drill bit body with one or more blades. The drill bit further comprises a plurality of primary cutters, each primary cutter located on at least one blade, and a plurality of secondary cutters, each secondary cutter located on at least one blade other than the blade on which the primary cutters are located.

20 Claims, 8 Drawing Sheets

(56) References Cited

U.S. PATENT DOCUMENTS

| | | | |
|---|---|---|---|
| 5,651,421 A * | 7/1997 | Newton | E21B 10/55 175/431 |
| 5,816,346 A * | 10/1998 | Beaton | E21B 10/55 175/431 |
| 6,123,161 A * | 9/2000 | Taylor | E21B 10/55 175/397 |
| 6,227,188 B1 * | 5/2001 | Tankala | B23B 31/005 125/13.01 |
| 7,316,279 B2 | 1/2008 | Wiseman et al. | |
| 7,703,557 B2 * | 4/2010 | Durairajan | E21B 10/43 175/426 |
| 8,020,641 B2 * | 9/2011 | Welch | E21B 10/43 175/426 |
| 8,047,307 B2 * | 11/2011 | Pessier | E21B 10/62 175/336 |
| 8,100,202 B2 * | 1/2012 | Durairajan | E21B 17/1092 175/426 |
| 8,720,609 B2 * | 5/2014 | Welch | E21B 10/56 175/379 |
| 8,899,357 B2 * | 12/2014 | Chen | G06F 30/20 175/335 |
| 8,899,358 B2 | 12/2014 | Yu et al. | |
| 9,115,552 B2 * | 8/2015 | Chen | E21B 10/42 |
| 10,000,976 B2 * | 6/2018 | Matthias | E21B 10/567 |
| 10,628,618 B2 * | 4/2020 | Mortimer | E21B 10/00 |
| 2005/0133272 A1 * | 6/2005 | Huang | E21B 10/00 175/327 |
| 2005/0154568 A1 * | 7/2005 | Huang | E21B 10/16 703/7 |
| 2005/0273302 A1 * | 12/2005 | Huang | E21B 10/00 703/10 |
| 2006/0157279 A1 * | 7/2006 | Cariveau | E21B 10/43 175/57 |
| 2007/0021857 A1 * | 1/2007 | Huang | E21B 10/00 703/7 |
| 2007/0240905 A1 | 10/2007 | Mensa-Wilnot | |
| 2008/0179107 A1 * | 7/2008 | Doster | E21B 10/43 703/1 |
| 2008/0296070 A1 * | 12/2008 | Shen | E21B 10/5673 76/108.4 |
| 2009/0055135 A1 * | 2/2009 | Tang | E21B 10/00 703/7 |
| 2010/0000800 A1 * | 1/2010 | Chen | E21B 10/55 175/428 |
| 2010/0139975 A1 * | 6/2010 | Teodorescu | E21B 12/02 175/39 |
| 2010/0259415 A1 * | 10/2010 | Strachan | G05B 13/048 340/853.6 |
| 2011/0031029 A1 * | 2/2011 | Gavia | E21B 10/43 175/428 |
| 2011/0284293 A1 * | 11/2011 | Shen | E21B 10/573 175/338 |
| 2012/0152617 A1 * | 6/2012 | Hunt | E21B 10/00 29/407.01 |
| 2012/0152624 A1 * | 6/2012 | Chen | E21B 10/43 175/428 |
| 2013/0035902 A1 * | 2/2013 | Endres | E21B 10/00 703/2 |
| 2016/0290055 A1 * | 10/2016 | Anderle | E21B 10/43 |
| 2019/0195024 A1 * | 6/2019 | Anderle | E21B 10/43 |

FOREIGN PATENT DOCUMENTS

| | | | |
|---|---|---|---|
| CN | 201027494 | 2/2008 | |
| CN | 201050304 | 4/2008 | |
| CN | 101351615 | 1/2009 | |
| CN | 101611213 | 12/2009 | |
| CN | 101672162 | 3/2010 | |
| CN | 201588550 | 9/2010 | |
| CN | 102216553 | 10/2011 | |
| CN | 102216554 | 10/2011 | |
| CN | 103237952 | 8/2013 | |
| EP | 1227214 | 7/2002 | |
| GB | 2368359 | 5/2002 | |
| GB | 2379682 | 3/2003 | |
| WO | WO-2015094221 A1 * | 6/2015 | B24D 99/005 |

OTHER PUBLICATIONS

Office Action received for Chinese Patent Application No. 201380080390.1, dated Mar. 16, 2017; 12 pages.
Office Action received for Chinese Patent Application No. 201380080390.1, dated Nov. 3, 2017; 11 pages.
Office Action received for Chinese Patent Application No. 201380080390.1, dated Apr. 25, 2018; 12 pages.
International Search Report and Written Opinion, Application No. PCT/US2013/76091; 18 pgs., dated Dec. 23, 2014.

* cited by examiner

CUTTING STRUCTURE DESIGN WITH SECONDARY CUTTER METHODOLOGY

RELATED APPLICATION

This application is a Divisional Application of U.S. patent application Ser. No. 15/037,273 filed May 17, 2016, which is a U.S. National Stage Application of International Application No. PCT/US2013/076091 filed Dec. 18, 2013, which designates the United States, and which are incorporated herein by reference in their entirety.

BACKGROUND

The present disclosure relates generally to well drilling operations and, more particularly, to a drill bit cutting structure.

Hydrocarbon recovery drilling operations typically require boreholes that extend hundreds or thousands of meters into the earth. The drilling operations themselves can be complex, time-consuming and expensive. One factor that adds to the expense of the drilling operation is the useful life of a drill bit used to bore the formation. Typically, when a drill bit wears out, the entire drill string must be removed from the borehole, the drill bit replaced, and then drilling re-commenced. Accordingly, the quicker a drill bit wears out, the more times the drill string must be removed, which delays the drilling progress.

With fixed cutter drill bits, a common way to optimize the useful life of the drill bit and its cutters is to add more cutters either by using smaller cutters, increasing cutter density, or adding blades to accommodate the additional cutters. The addition of cutters, however, affects drilling efficiencies by requiring more Weight On Bit ("WOB") and Torque On Bit ("TOB") to bring the rock to failure.

FIGURES

Some specific exemplary embodiments of the disclosure may be understood by referring, in part, to the following description and the accompanying drawings.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to well drilling operations and, more particularly, to a drill bit cutting structure.

Illustrative embodiments of the present disclosure are described in detail herein. In the interest of clarity, not all features of an actual implementation may be described in this specification. It will of course be appreciated that in the development of any such actual embodiment, numerous implementation-specific decisions must be made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

To facilitate a better understanding of the present disclosure, the following examples of certain embodiments are given. In no way should the following examples be read to limit, or define, the scope of the disclosure. Embodiments of the present disclosure may be applicable to horizontal, vertical, deviated, multilateral, intersection, bypass (drill around a mid-depth stuck fish and back into the well below), or otherwise nonlinear wellbores in any type of subterranean formation. Embodiments may be applicable to injection wells, and production wells, including natural resource production wells such as hydrogen sulfide, hydrocarbons or geothermal wells; as well as borehole construction for river crossing tunneling and other such tunneling boreholes for near-surface construction purposes or borehole u-tube pipelines used for the transportation of fluids such as hydrocarbons. Embodiments described below with respect to one implementation are not intended to be limiting.

The terms "couple" or "couples" as used herein are intended to mean either an indirect or a direct connection. Thus, if a first device couples to a second device, that connection may be through a direct connection, or through an indirect mechanical or electrical connection via other devices and connections.

Figure 1:
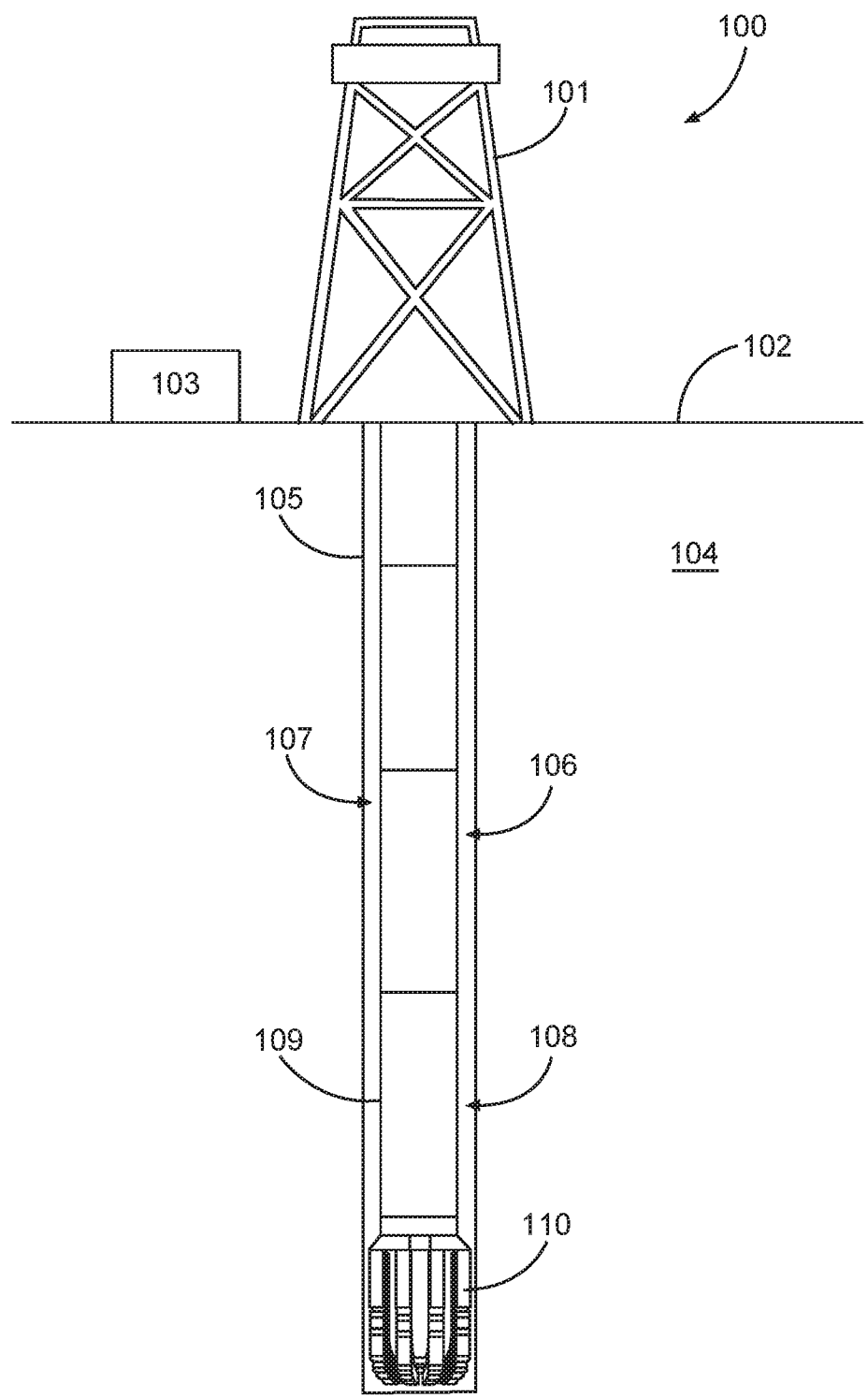
FIG. 1 is a schematic illustration of an example drilling system, according to aspects of the present disclosure.

Referring now to the figures, FIG. 1 shows an example drilling system 100, according to aspects of the present disclosure. The drilling system 100 includes rig 101 mounted at the surface 102 and positioned above borehole 105 within a subterranean formation 104. In the embodiment shown, a drilling assembly 106 may be positioned within the borehole 105 and may be coupled to the rig 101. The drilling assembly 106 may comprise drill string 107 and bottom hole assembly (BHA) 108. The drill string 107 may comprise a plurality of segments threadedly connected. The BHA 108 may comprise a drill bit 110, a measurement-while-drilling (MWD)/logging-while-drilling section 109. The drill bit 110 may be a fixed cutter drill bit or any another drill bit type that would be appreciated by one of ordinary skill in the art in view of this disclosure. Although drill bit 110 is shown coupled to a conventional drilling assembly 106, other drilling assemblies are possible, including wireline or slickline drilling assemblies. As the drilling operation is undertaken, and the drill bit 110 rotates to remove portions of the formation 104 in front of the bit, the friction and heat from the removal process causes the drill bit to wear down. After a certain amount of wear, the bit 110 must be replaced, which means removing the entire drill string 107 from the borehole 105, replacing the bit 110, and running the drill string 107 back into the borehole 105. This can be costly and time consuming. Accordingly, the longer a bit can drill efficiently without being changed reduces the time and cost of drilling a well.

Figure 2:
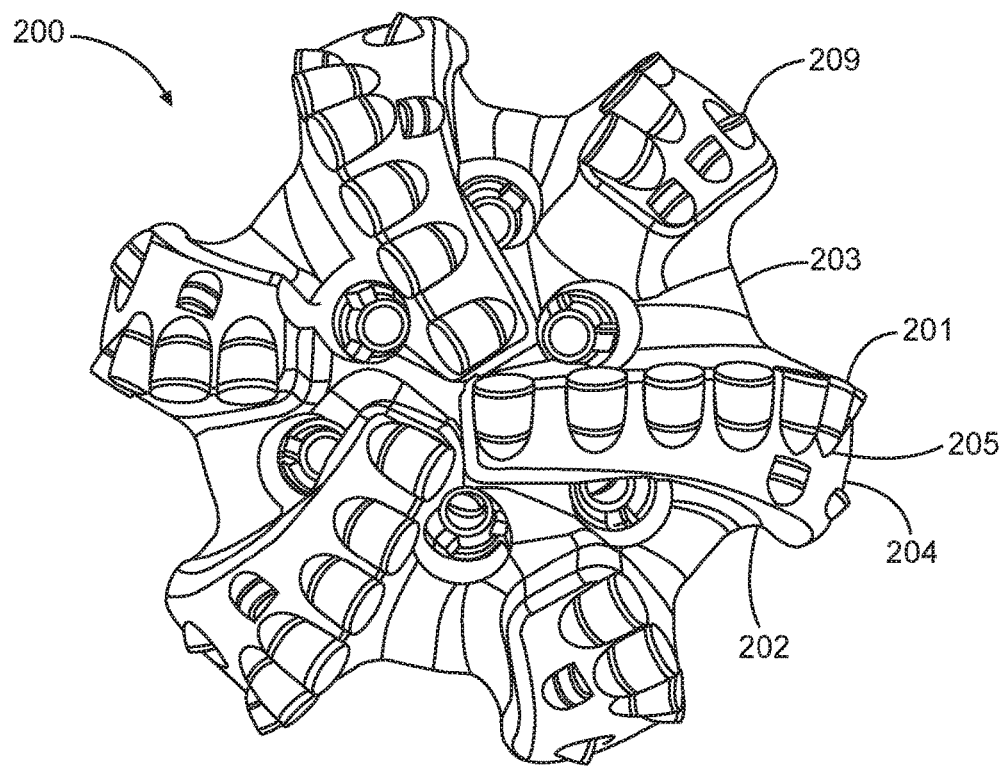
FIG. 2 is a schematic illustration of an example fixed cutter drill bit, according to aspects of the present disclosure.

FIG. 2 illustrates an example drill bit 200 for subterranean drilling operations, according to aspects of the present disclosure. In the embodiment shown, the drill bit 200 comprises a fixed cutter drill bit. The drill bit 200 comprises a body 203, one or more blades 202, and a plurality of primary cutters 201 disposed on a cutting surface of the blades 202. The number and orientation of the blades 202 may be altered according to design parameters that would be appreciated by one of ordinary skill in the art in view of this disclosure. The bit body 203 may support the one or more blades 202 and may, for example, be fully manufactured in steel or made of a metal matrix composite around a steel blank. The plurality of primary cutters 201 may contact the rock in the formation and remove the rock as the drill bit 200 rotates. The plurality of primary cutters 201 may generally be made of diamond. For example, the plurality of primary cutters 201 may be made of synthetic diamond powder, such as Polycrystalline Diamond Compacts or Thermally Stable Polycrystalline Diamond; natural diamonds, or impregnated diamonds. The plurality of primary cutters 201 may extend outward in a radial direction from a longitudinal axis of the drill bit.

The drill bit 200 may also comprise a plurality of secondary cutters 209 disposed on a cutting surface of the one or more blades 202. The plurality of secondary cutters 209 may contact the rock in the formation and remove the rock as the drill bit 200 rotates. Each of the plurality of secondary cutters 209 may be located on at least one blade 202 other than the blade on which the primary cutter 201 that it follows is located. In preferred embodiments, the secondary cutters 209 may be placed in one of two locations: (1) as close to 180 degrees from at least one of the plurality of primary cutters 201 to balance forces when the critical depth of cut causes the secondary cutter 201 to become engaged, or (2) on the blade 202 directly preceding at least one of the plurality of primary cutters 201 to minimize interaction from engagement with cutting paths from other cutters. As would be appreciated by one of ordinary skill in the art, the secondary cutters 209 will not be placed on the same blade 202 as the primary cutters 201 for a variety of reasons including, but not limited to, underexposure tolerance, distribution of cutter forces, and cutter engagement.

In certain embodiments, the plurality of secondary cutters 209 may be used to remove only small amounts of confined rock, based on the exposure level of each secondary cutter 209 and the radial location of each secondary cutter 209 relative the primary cutter 201 it is following, regardless of the circumferential location of the secondary cutter 209. In certain embodiments in accordance with the present disclosure, the exposure of the plurality of secondary cutters 209 (i.e., the extent to which the secondary cutters 209 are exposed in order to contact the rock) may be adjusted in order to customize loading on the plurality of primary cutters 201, prevent wear, and minimize effects on drill bit efficiency. In accordance with the present disclosure, the exact exposure of the plurality of secondary cutters 209 may vary as necessary to customize loading on the primary cutters 201, according to certain visual observations and outputs discussed herein related to various drill bit and/or drilling properties, areas of engagement of cutters, arc lengths of engagement, etc. For example, in certain embodiments, each secondary cutter 209 may have a different exposure. In others embodiments, the exposure of the plurality of secondary cutters 209 may be configured so that the secondary cutters 209 do not all contact the rock simultaneously. As would be appreciated by one of ordinary skill in the art with the benefit of the present disclosure, by varying and/or adjusting the exposure of the plurality of secondary cutters 209, the load experienced by the plurality of primary cutters 201 may be reduced, while the load on the plurality of secondary cutters 209 may be only slightly increased. In addition, the back rake and side rake angle may be adjusted to minimize load on the secondary cutters 209, and thus minimize effect on WOB and TOB.

In certain embodiments, the plurality of secondary cutters 209 may be located in the same path as the plurality of primary cutters 201, meaning each secondary cutter 209 may be placed at an equivalent radial position relative to the primary cutter 201 it is following. In other embodiments, the plurality of secondary cutters 209 may not be located in the same path as the plurality of primary cutters 201. Instead, the plurality of secondary cutters 209 may be located radially inward or outward from the primary cutters 201. As would be appreciated by one of ordinary skill in the art, the shape of the cutter engagement may also affect loading of the cutter. Moving the secondary cutters 209 inward or outward radially may allow the secondary cutters 209 to cut a different shape of rock that may be confined differently due to bottom hole pattern generated by the plurality of both primary and secondary cutters 201, 209. For example, in some situations equivalent areas of rock to cutter engagement may require different loads to fail the rock. This can be due to both geometry and confined arc length of engagement changing the load required to fracture the rock.

In certain embodiments in accordance with the present disclosure, the secondary cutters 209 may be smaller than the primary cutters 201, larger than the primary cutters, or shaped elements such as scribe cutters. The smaller cutter element size may be used to customize the engagement patterns at a higher resolution than a larger cutter may allow.

As further shown in FIG. 2, at least one pocket 205 may be present on one of the blades 202, and a primary cutter 201 and a secondary cutter 209 may be at least partially disposed within a pocket 205. As will be described in detail below, a pocket 205 may comprise a notched or recessed area on an outer surface of a blade 202. In the embodiment shown, each of the blades 202 may comprise a plurality of pockets spaced along a cutting structure 204 of the drill bit 200. The cutting structure 204 of the drill bit 200 may comprise the portion of the drill bit 200 that removes rock from a formation during a drilling operation. The pocket 205 may be formed during the manufacturing process that forms the blades 202 or may be machined later. Like the number and orientation of the blades 202, the number and orientation of pockets 205 and cutters 201, 209 on the blades 202 may be altered according to design parameters that would be appreciated by one of ordinary skill in the art in view of this disclosure.

Figure 3A:
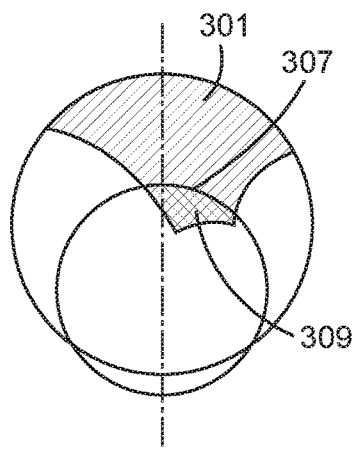
FIGS. 3A and 3B are schematic illustrations of exemplary placement of secondary cutters on a drill bit, relative to primary cutters on a drill bit, according to aspects of the present disclosure.
Figure 3B:
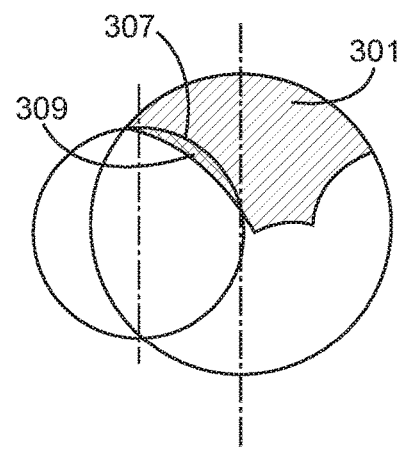

FIGS. 3A and 3B are diagrams illustrating examples of alternative placements of the plurality of secondary cutters (reference numeral 209 in FIG. 2) in relation to the plurality of primary cutters (reference numeral 201 in FIG. 2), according to aspects of the present disclosure. FIG. 3A illustrates the placement of the plurality of the secondary cutters (reference numeral 209 in FIG. 2) in the same path as the plurality of primary cutters (reference numeral 201 in FIG. 2) and located on any blade other than the blade on which the primary cutters (reference numeral 201 in FIG. 2) are located, preferably on the blade directly preceding the primary cutters (reference numeral 201 in FIG. 2) or 180 degrees around. The section denoted with reference numeral 309 illustrates the area of engagement of a secondary cutter (reference numeral 209 in FIG. 2). The section denoted with reference number 301 illustrates the area of engagement of a primary cutter (reference numeral 201 in FIG. 2). The arc length of engagement is denoted with reference numeral 307. As shown in FIG. 3A, the centerline of a secondary cutter (reference numeral 209 in FIG. 2) and the centerline of a primary cutter (reference numeral 201 in FIG. 2) line up. In this configuration, the secondary cutter (reference numeral 209 in FIG. 2) removes rock located at the centerline. As shown in FIG. 3A, the portion of rock engaged by the secondary cutters 309 has a high area of engagement to confined arc length of engagement ratio and thus may be removed with relatively low load per area. In this configuration, the secondary cutter (reference numeral 209 in FIG. 2) may engage easy to remove rock near the centerline of the secondary cutter (reference numeral 209 in FIG. 2) and the primary cutter (reference numeral 201 in FIG. 2).

FIG. 3B illustrates the placement of the plurality of the secondary cutters (reference numeral 209 in FIG. 2) offset radially from the primary cutters (reference numeral 201 in FIG. 2) and located on any blade other than the blade on which the primary cutters (reference numeral 201 in FIG. 2) are located, preferably on the blade directly preceding the primary cutters (reference numeral 201 in FIG. 2) or 180 degrees around. As with FIG. 3A, the section denoted with reference numeral 309 illustrates the area of engagement of a secondary cutter (reference numeral 209 in FIG. 2), and the section denoted with reference number 301 illustrates the area of engagement of a primary cutter (reference numeral 201 in FIG. 2). The arc length of engagement is denoted with reference numeral 307. As shown in FIG. 3B, the centerline of a secondary cutter (reference numeral 209 in FIG. 2) and the centerline of a primary cutter (reference numeral 201 in FIG. 2) are offset from one another and do not line up. In this configuration, the portion of the rock engaged by the secondary cutters (reference numeral 209 in FIG. 2) has a low area of engagement to confined arc length of engagement ratio and thus may require a relatively large load to area to fail the rock. In this configuration, the plurality of secondary cutters (reference numeral 209 in FIG. 2) may engage more confined rock near the centerline of the plurality of secondary cutters (reference numeral 209 in FIG. 2).

Figure 4A:
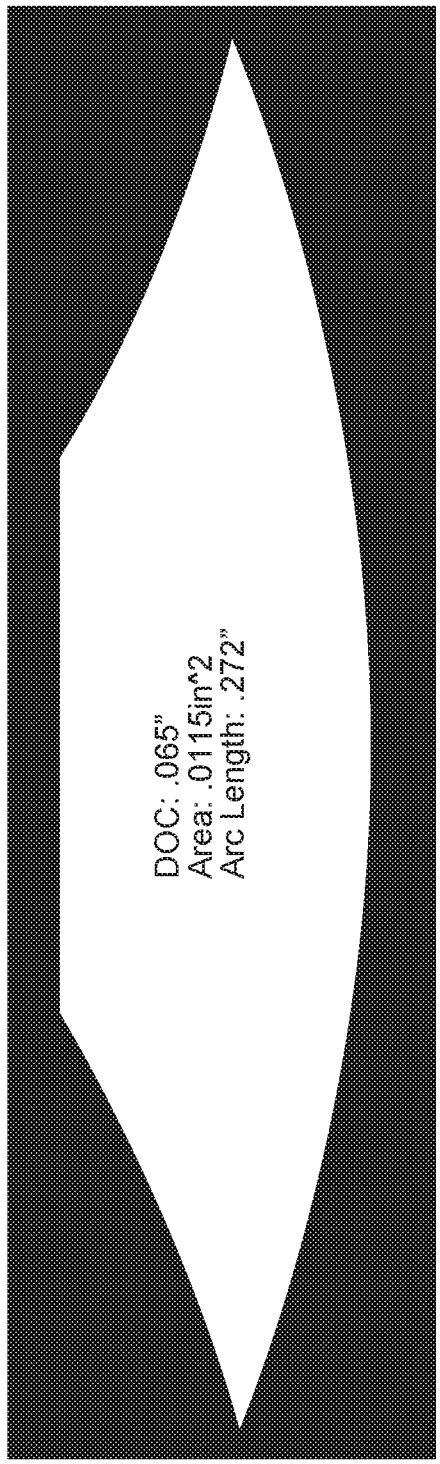
FIGS. 4A and 4B are schematic illustrations of exemplary areas of engagement, according to aspects of the present disclosure.
Figure 4B:
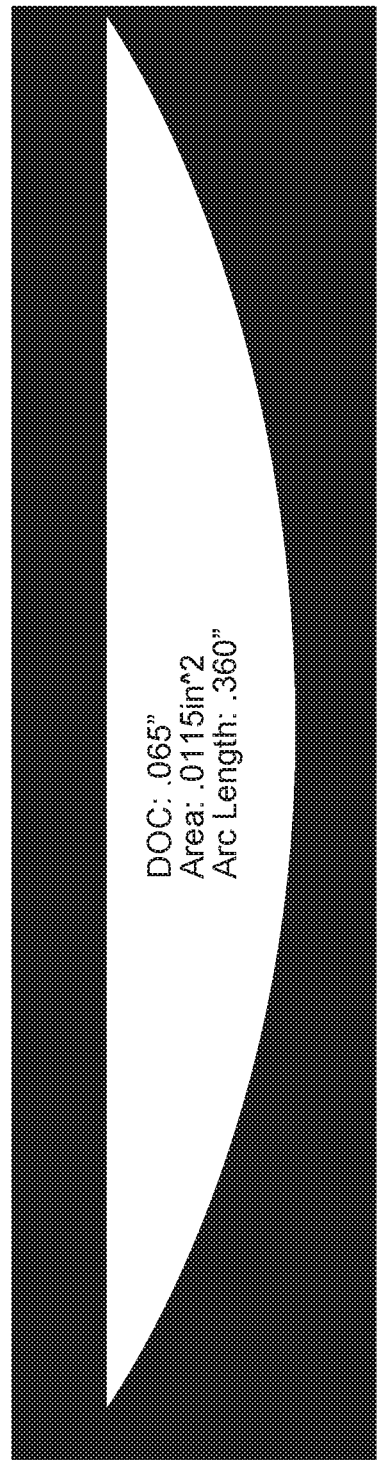
Figure 4C:
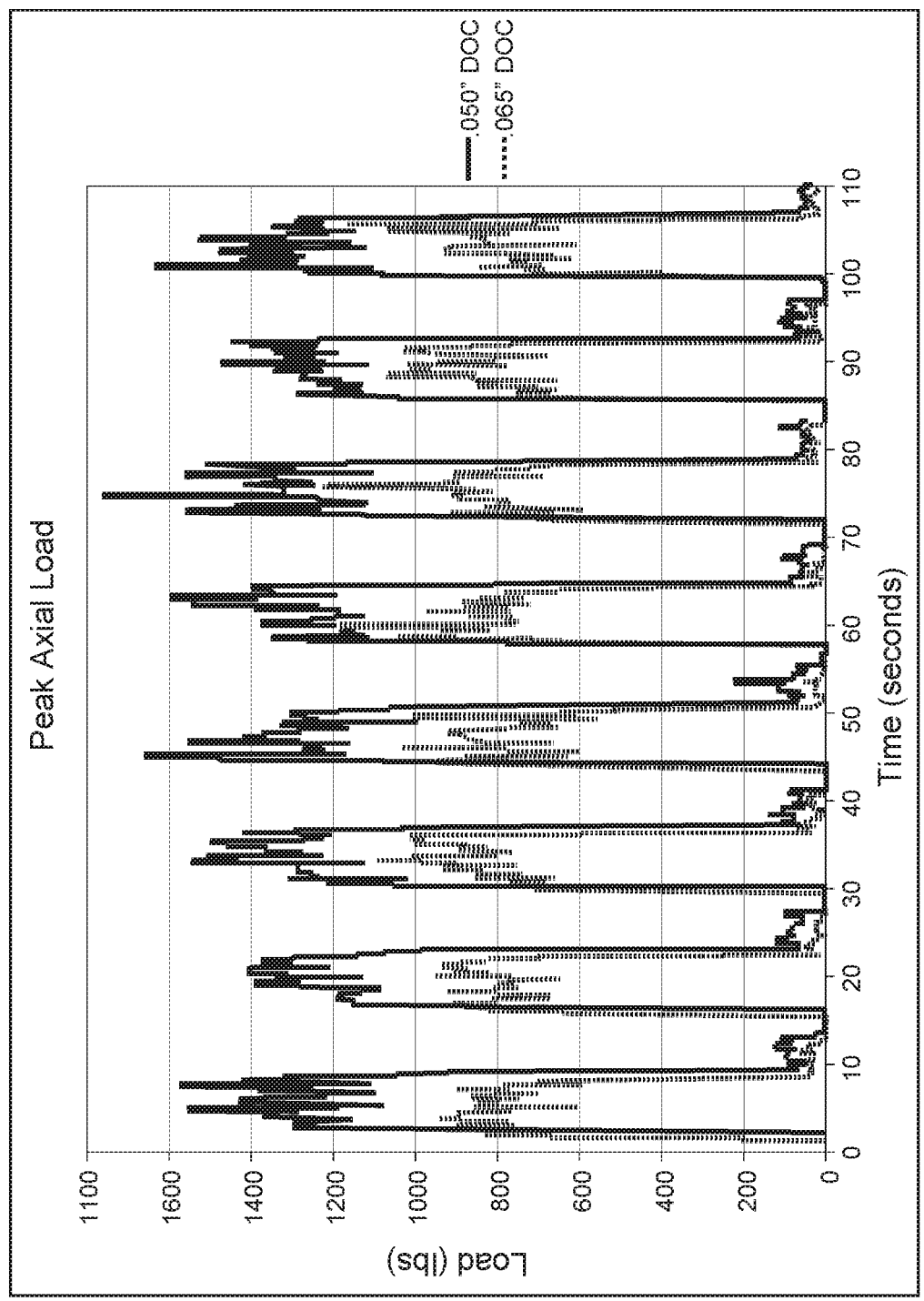
FIGS. 4C and 4D are exemplary loading plots corresponding to the exemplary areas of engagement in FIGS. 4A and 4B.
Figure 4D:
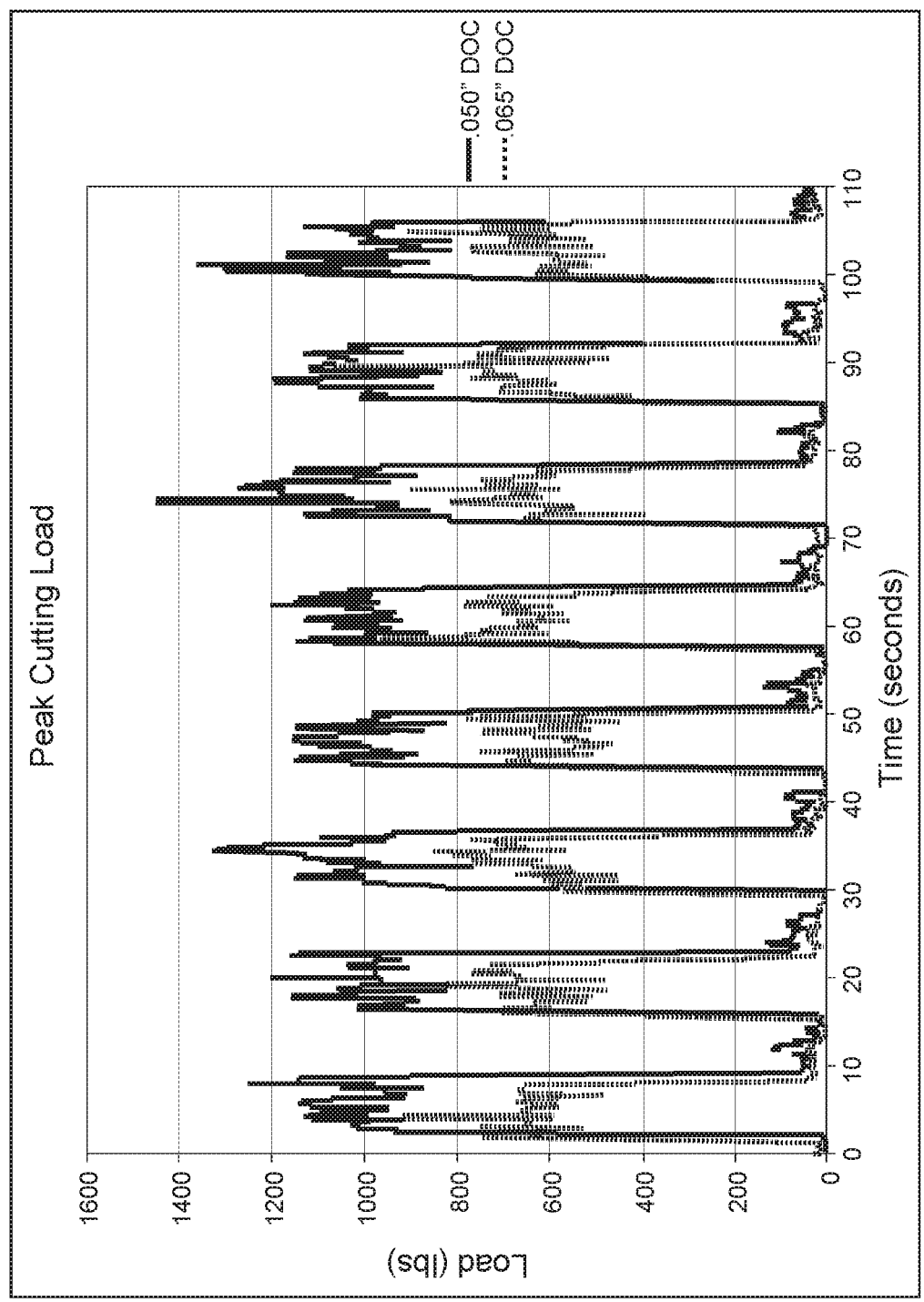

FIGS. 4A and 4B are diagrams illustrating exemplary areas of engagement with identical areas of engagement, calculated in square inches, corresponding to the two exemplary alternative areas of secondary cutter engagement 309 illustrated in FIGS. 3A and 3B. In this example, the areas of secondary cutter engagement are 0.0115 inches squared. While the areas of secondary cutter engagement may be identical, the arc length of engagement in FIG. 4B (approximately 0.360 inches) is greater than the arc length of engagement shown in FIG. 4A (0.272 inches). FIGS. 4C and 4D plot the peak axial load and the peak cutting load of both exemplary areas of engagement. As described above, and as illustrated in FIGS. 4C and 4D, a higher axial load and cutting load are required to fail the rock in the illustrative embodiment of FIG. 4B (approximately 1,250 lbs of axial load and 1,000 lbs of drag load), than in the illustrative embodiment of FIG. 4A (approximately 750 lbs of axial load and 750 lbs of drag load).

With reference to FIG. 2, according to aspects of the present disclosure, the effective life of the drill bit 200 depends, in part, on the distribution and number of cutters on the drill bit and the placement of secondary cutters in certain maximum wear areas on the bit that would normally endure the greatest cutter wear and/or cutter damage and thus wear down more quickly than the remainder of the bit cutting structure. In accordance with certain aspects of the present disclosures, these "max wear" areas on the bit may include, but are not limited to, areas where the primary cutters 201 experience maximum energy, maximum load, maximum torque, maximum speed, maximum engagement, and/or maximum volume. As will be appreciated by one of ordinary skill in the art in view of this disclosure, once an area of the bit has been worn down, the bit must be removed from the borehole, even if the remainder of the bit has available diamond. In one exemplary embodiment, as will be discussed below within the context of this disclosure, an area of the fixed cutter bit may be characterized as "max wear" at the location where the energy endured by the cutters before the cutter wear/cutter damage is at its max (i.e., "max energy"). While this disclosure discusses the "max wear" areas in the context of areas experiencing "max energy," this disclosure is not intended to be limiting. A bit design method according to aspects of the present disclosure may extend the life of the drill bit by strategically placing the plurality of secondary cutters 209 in the "max wear" areas of the drill bit, thereby prolonging the useful life of the drill bit 200 and maintaining or even increasing drilling efficiency. As would be appreciated by one of ordinary skill in the art with the benefit of the present disclosure, the placement of the plurality of secondary cutters 209 in relation to the plurality of primary cutters 201, as illustrated in FIGS. 3A and 3B, as well as the areas of engagement and arc lengths of engagement, as illustrated in FIGS. 4A and 4B, may be used to strategically place the plurality of secondary cutters 209 in certain locations to provide the greatest benefit from a cutter wear and cutter loading perspective. Specifically, the secondary cutters may be strategically placed on the drill bit in order to reduce cutter wear and cutter loading.

Cutter wear and/or cutter damage may be a function of various drill bit and/or drilling properties (i.e., parameters), including, but not limited to, velocity of the cutter (i.e., cutting speed), drag loading, axial loading, radial loading, total loading, area of rock engaged, volume of rock removed by the cutter, length of cut, arc length of engagement, torque, energy, power, work, temperature, friction, rock properties, such as hardness, abrasiveness, porosity, compressive strength, uniformity, etc, or any combination of such parameters. The rock properties are difficult to predict and measure, but the velocity of the cutter and any other measurable parameters listed above may be used to approximate cutter wear and/or cutter damage. According to certain aspects of the present disclosure, cutter wear and/or cutter damage may be approximated using any of the parameters listed above, including kinetic energy ("KE") and mechanical specific energy ("MSE"), which may be calculated as a function of the above enumerated parameters. In certain embodiments, the following KE and MSE equations may be used to approximate cutter wear and cutter damage:

$$KE = \frac{1}{2} * I * w^2 \quad (1)$$

$$MSE = (\tau * RPM)/(ROP * A) + WOB/A \quad (2);$$

where I is moment of inertia, w is angular velocity, $\tau$ is torque, and A is surface area of cutting path. ROP is rate of penetration of the drill bit, RPM is revolutions per minute, and WOB is weight on bit.

In some embodiments, simulations or models may be conducted based on the parameters to approximate cutter wear and/or cutter damage and determine the "max wear" areas of the drill bit. An information handling system may be utilized to conduct the simulations or models. As would be appreciated by one of ordinary skill in the art with the benefit of the present disclosure, any suitable simulation software may be utilized by the information handling system for this purpose, including, but not limited to, the iBitS™ design software designed and manufactured by Halliburton Company (Houston, Tex.). Specifically, iBitS™ Grapher, a graphical interface written in Matlab, may be utilized. Matlab may read data from iBitS™ (CAD) and may solve equations that may be built into the system to predict the above information and present them to the designer through iBitS™ Grapher.

In certain exemplary embodiments, the "max wear" areas of the drill bit may be determined using wear representations that illustrate any one or more of the parameters as a function of cutter distribution on the drill bit. In one exemplary embodiment, the wear representations may be generated using a fixed cutter drill bit model that models any particular parameter over the distribution of primary cutters on a drill bit.

In certain embodiments in accordance with the present disclosure, a dull bit (not shown) may be observed and measured, and specific cutter wear (i.e., which cutter elements are experiencing the wear) and wear amounts recorded. As would be understood by one of ordinary skill in the art with the benefit of the present disclosure, a dull bit is a bit that has already been run and experienced wear. In accordance with certain embodiments of the present disclosure, cutter wear and/or cutter damage may be approximated without the assistance of simulations or models by observing a dull bit. In other embodiments in accordance with the present disclosure, parameters, including, but not limited to, velocity of the cutter (i.e., cutting speed), drag loading, axial loading, radial loading, total loading, area of rock engaged, volume of rock removed by the cutter, length of cut, arc length of engagement, torque, energy, power, work, temperature, friction, rock properties, such as hardness, abrasiveness, porosity, compressive strength, uniformity, etc, or any combination of such parameters may be entered into the iBitS™ software tool or calculated by iBitS™, producing several outputs. The outputs may include any one or more of the above listed parameters, and may be reviewed to identify which output or calculation best matches the dull bit characteristics. Once the correlation is made, the plurality of secondary cutters (reference numeral 209 in FIG. 2) may be placed in specific locations to reduce, either directly or indirectly, the output to a level in which the cutter wear is negligible when correlated to the dull bit. For example, the secondary cutters (reference numeral 209 in FIG. 2) may be placed in a specific locations to reduce engagement area. This reduction of engagement area may in turn reduce the effect of cutting speed on cutter wear.

As would be appreciated by one of ordinary skill in the art with the benefit of this disclosure, multiple parameters and corresponding outputs that correlate best to cutter wear may provide a wear model that may be used to optimally place the secondary cutters (reference numeral 209 in FIG. 2) on the drill bit. As would be appreciated by one of skill in the art with the benefit of this disclosure, selection of a drill bit configuration and cutter distribution, particularly the location of the secondary cutters (reference numeral 209 in FIG. 2), may be based on past simulation results, field results, calculated parameters, and/or any other suitable criteria. As would be appreciated by one of skill in the art, parameters relating to cutter distribution may be input into the information handling device using any suitable simulation software.

Figure 5A:
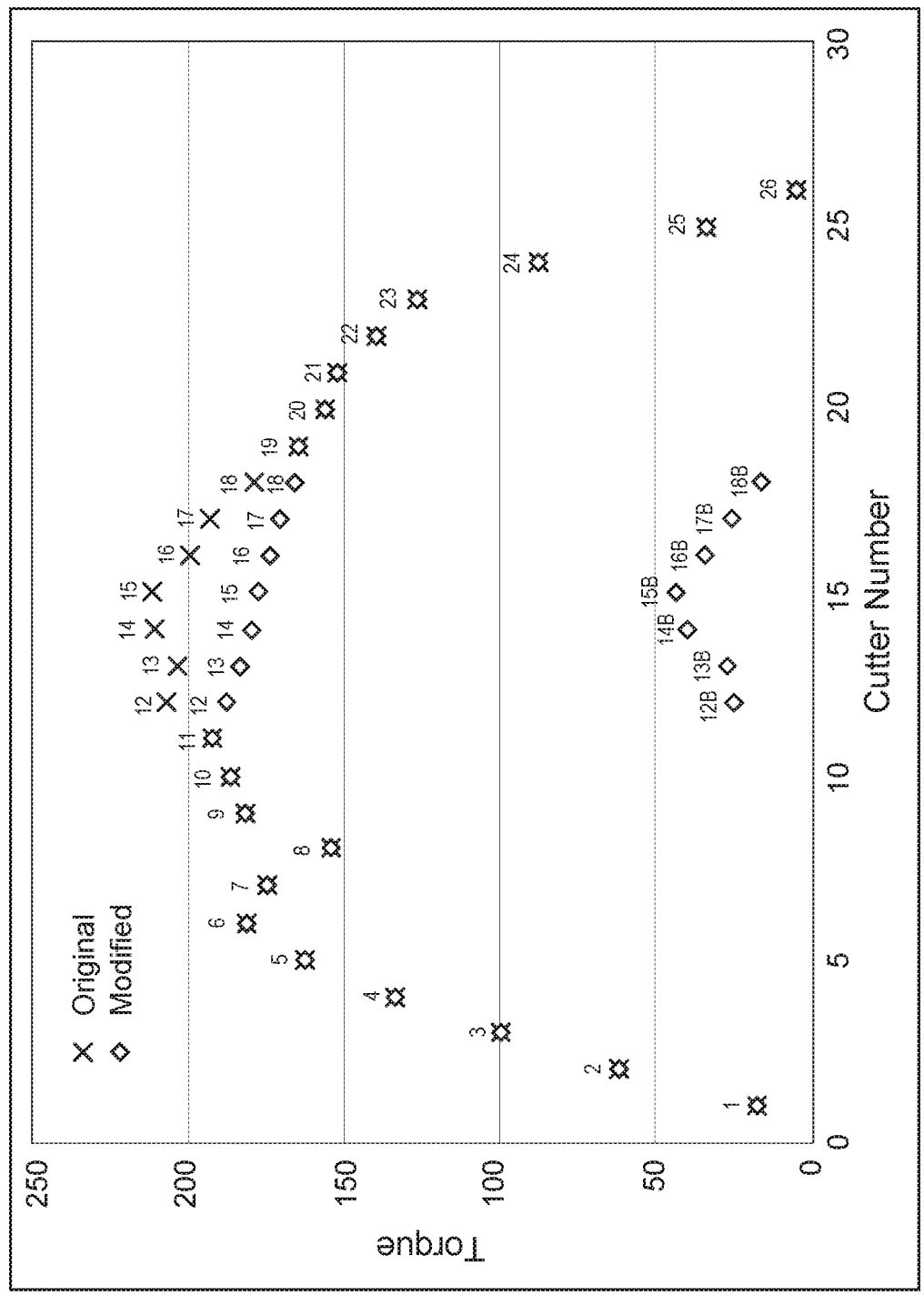
FIGS. 5A-5C are exemplary wear representation where certain drill bit and/or drilling properties are plotted as a function of cutter distribution on the drill bit, according to aspects of the present disclosure.
Figure 5B:
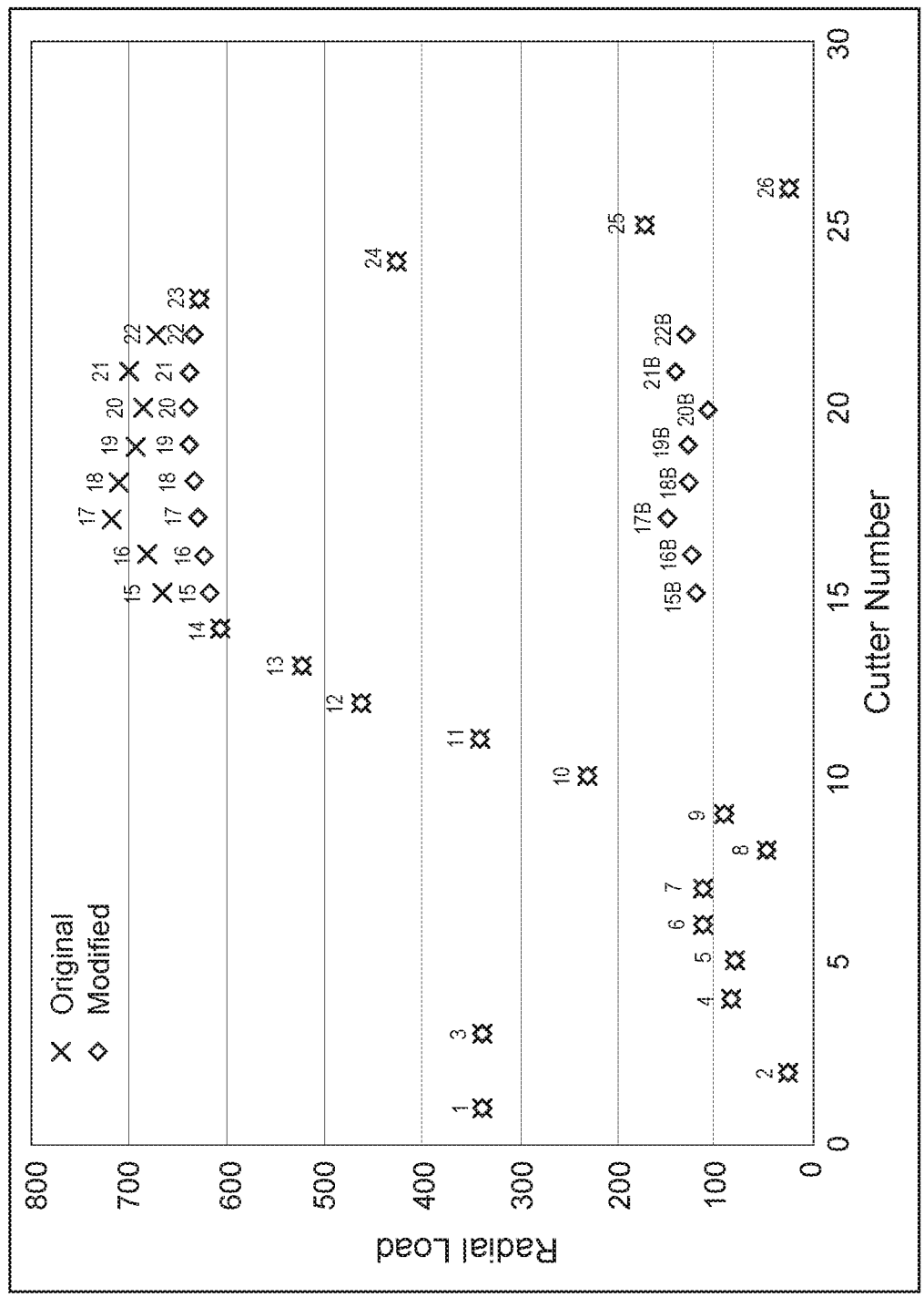

FIGS. 5A and 5B illustrate exemplary "max wear" representations in which torque and radial load, respectively, are illustrated as a function of the primary cutter distribution on the drill bit. FIGS. 5A and 5B plot the predicted cutter wear and/or cutter damage corresponding to the point at which the torque and radial load, respectively, are the highest for a plurality of primary cutters (reference numeral 201 in FIG. 2), and plot the predicted cutter wear and/or cutter damage corresponding to the point at which the torque and radial load, respectively, are the highest for a modified cutter distribution including both primary and secondary cutters (reference numerals 201 and 209, respectively, in FIG. 2). Specifically, FIGS. 5A and 5B illustrate that secondary cutters (reference numeral 209 in FIG. 2) may be used to minimize torque and radial load, respectively, in the specific locations where the torque and radial load, respectively, were the highest.

Figure 5C:
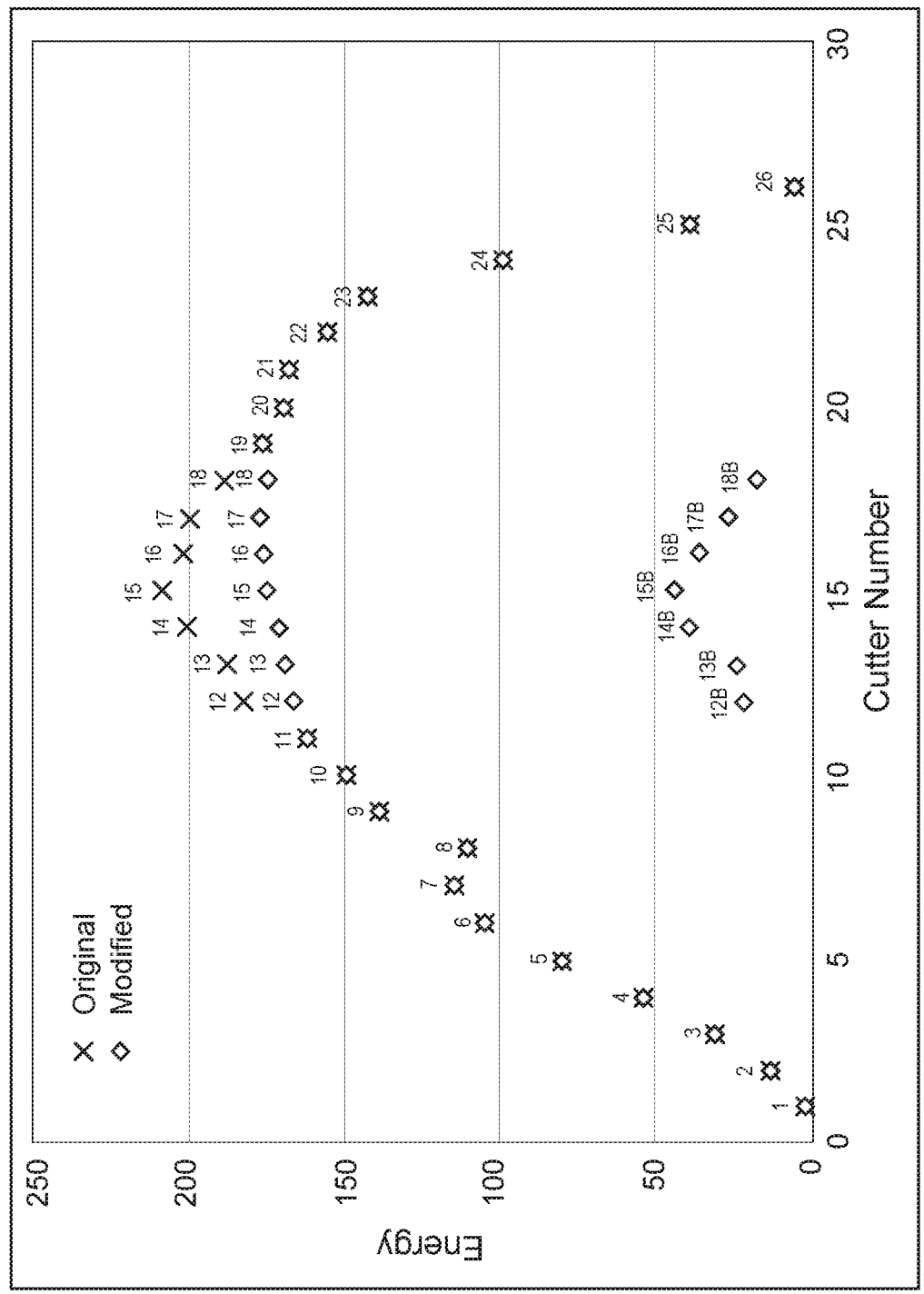

FIG. 5C illustrates an exemplary "max wear" representation in which kinetic energy is illustrated as a function of the primary cutter distribution on the drill bit. FIG. 5C plots the predicted cutter wear and/or cutter damage corresponding to the point at which the kinetic energy is the highest for a plurality of primary cutters (reference numeral 201 in FIG. 2), and the predicted cutter wear and/or cutter damage corresponding to the point at which the kinetic energy is the highest for a modified cutter distribution including both primary and secondary cutters (reference numerals 201 and 209, respectively, in FIG. 2). Specifically, FIG. 5C illustrates that secondary cutters (reference numeral 209 in FIG. 2) may be used to minimize energy in the specific locations where kinetic energy was the highest. The kinetic energy distribution over the cutters of drill bit may be characterized by the velocity of the cutter, drag force of the cutter on the rock and/or the area of rock engaged by the cutter, and specific rock properties. In certain embodiments, the average ROP and RPM of the drill bit may be entered into the information handling system employing, for example, the iBitS™ software tool, and used to calculate the kinetic energy endured at each primary cutter (reference numeral 201 in FIG. 2).

In accordance with the present disclosure, the wear representations may be generated for a variety of different primary cutter configurations to determine the placement of the secondary cutters and thus maximize the useful life of the drill bit. The wear representations may comprise graphical, three-dimensional representations that may be generated within the information handling system having a processor and at least one memory device. The memory device may contain instructions that, when executed, cause the processor to generate a wear representation based on certain preselected conditions. The set of instructions may be included as part of existing software or modeling programs. For example, a wear representation may be generated as part of design software, including iBitS™ design software and CAD software, and allow for the validity of the resulting cutter distribution.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network computer, a network storage device, or any other suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. The processing resources may include other processors such as graphical processing units (GPU). Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As would be appreciated by those of ordinary skill in the art, with the benefit of this disclosure, one or more information handling systems may be used to implement the methods disclosed herein. Specifically, the one or more information handling systems may include machine-readable instructions to perform the methods disclosed herein. In certain embodiments, the different information handling systems may be communicatively coupled through a wired or wireless system to facilitate data transmission between the different subsystems. The structure and operation of such wired or wireless communication systems is well known to those of ordinary skill in the art having the benefit of the present disclosure and will therefore, not be discussed in detail herein. Moreover, each information handling system may include storage media and/or memory and may be any computer-readable media that stores data either permanently or temporarily.

For the purposes of this disclosure, storage media and/or memory may include any one or a combination of volatile or nonvolatile local or remote devices suitable for storing information. For example, storage media and/or memory may include a direct access storage device (e.g., a hard disk drive or floppy disk drive), a sequential access storage device (e.g., a tape disk drive), compact disk, CD-ROM, DVD, RAM, ROM, electrically erasable programmable read-only memory ("EEPROM"), a solid state drive ("SSD"), flash memory, magnetic storage devices, optical storage devices, network storage devices, cloud storage devices, or any other suitable information storage device or a combination of these devices.

According to aspects of the present disclosure, an example method for placement of the plurality of secondary cutters (reference numeral 209 in FIG. 2) on a drill bit may comprise receiving at a processor of an information handling system a drill bit characteristic. The drill bit characteristic may comprise the velocity of the cutter (i.e., cutting speed), drag loading, axial loading, radial loading, total loading, area of rock engaged, volume of rock removed by the cutter, length of cut, arc length of engagement, torque, energy, power, work, temperature, friction, rock properties, such as hardness, abrasiveness, porosity, compressive strength, uniformity, etc, or any combination of such parameters, and may be entered by a user of the information handling system as part of a design program. The method may further comprise generating an output of the drill bit based, at least in part, on the drill bit characteristic. The output may be a wear representation. The wear representation may then be displayed.

According to aspects of the present disclosure, an example system for placement of the plurality of secondary cutters (reference numeral 209 in FIG. 2) on a drill bit may comprise a processor and a memory device coupled to the processor. The system may further comprise an information handling system. The memory device may comprise a set of instructions that, when executed by the processor, causes the processor to receive a drill bit characteristic. The drill bit characteristic may be entered or determined by a user of the system. The set of instructions may further cause the processor to generate a wear representation of the drill bit based, at least in part, on the drill bit characteristic.

As would be appreciated by one of ordinary skill in the art with the benefit of the present disclosure, using a plurality of secondary cutters may have an effect on drilling efficiency. Specifically, it may affect WOB and TOB. As would be appreciated by one of skill in the art with the benefit of the present disclosure, cutting efficiency may be highly dependent on magnitude of cutter wear. For example, if a cutter stays sharp (meaning there is little to no wear) it will drill more efficiently requiring less WOB and TOB to remove a given volume of rock. As the cutter wears, more axial surface area is exposed needing more WOB and more TOB to overcome the additional friction. While adding secondary cutters may slightly reduce cutting efficiency initially, the secondary cutters may serve to keep the primary cutters sharp longer, improving overall efficiency. Moreover, cutting efficiency may relate to how efficiently WOB is transferred through the cutters to fail the rock. For example, the most efficient cutting may take place in the direction of WOB. The plurality of secondary cutters may be placed on the drill bit so that the direction of WOB is used most efficiently in order to remove the hard to remove rock that the primary cutter would have the most difficulty removing, thus allowing the primary cutters to increase overall efficiency.

An embodiment of the present disclosure is a drill bit for subterranean drilling operations. The drill bit includes a drill bit body with one or more blades. The drill bit further includes a plurality of primary cutters, and each primary cutter is located on at least one blade. The drill bit further includes a plurality of secondary cutters, and each secondary cutter is located on at least one blade other than the blade on which the primary cutters are located.

Optionally, at least one of the plurality of secondary cutters is located as close to 180 degrees from at least one of the plurality of primary cutters. Optionally, at least one of the plurality of secondary cutters is located directly preceding at least one of the plurality of primary cutters. Optionally, at least one of the plurality of secondary cutters is offset radially from at least one of the plurality of primary cutters. Optionally, at least one of the plurality of secondary cutters is located in the same path as at least one of the plurality of primary cutters. Optionally, at least one of the plurality of secondary cutters is located radially inward or outward from the primary cutters. Optionally, the plurality of secondary cutters are placed in areas of the drill bit that experience the max amount of wear on the plurality of primary cutters. Optionally, each of the plurality of secondary cutters has a degree of exposure and the degree of exposure of each secondary cutter is selected based on an output of the drill bit, wherein the output of the drill bit is based, at least in part, on a drill bit characteristic. Optionally, the drill bit may be a fixed cutter drill bit.

Another embodiment of the present disclosure is a method for determining the placement of a plurality of secondary cutters on a drill bit. The method includes receiving at a processor of an information handling system a drill bit characteristic related to a plurality of primary cutters. The method further includes generating an output of the drill bit based, at least in part, on the drill bit characteristic.

Optionally, the drill bit is a fixed cutter drill bit and the drill bit characteristic is selected from a group consisting of:

velocity of the cutter, drag loading, axial loading, radial loading, total loading, area of rock engaged, volume of rock removed by the cutter, length of cut, arc length of engagement, torque, energy, power, work, temperature, friction, rock hardness, rock abrasiveness, rock porosity, rock compressive strength, rock uniformity, and any combination thereof. Optionally, the output comprises a wear representation, wherein the wear representation is based, at least in part, on the drill bit characteristic. Optionally, the wear representation comprises a two-dimensional visual representation. Optionally, the method further includes displaying the wear representation. Optionally, the method further includes reviewing the wear representation to determine the placement of the plurality of secondary cutters on the drill bit. Optionally, the method further includes placing each of the plurality of secondary cutters on at least one blade other than the blade on which the plurality of primary cutters are located.

Another embodiment of the present disclosure is a system for determining the placement of a plurality of secondary cutters on a drill bit. The system includes a processor and a memory device coupled to the processor. The memory device includes a set of instructions that, when executed by the processor, causes the processor to receive a drill bit characteristic and generate a wear representation of the drill bit. Optionally, the drill bit is a fixed cutter drill bit and the drill bit characteristic is selected from a group consisting of: velocity of the cutter, drag loading, axial loading, radial loading, total loading, area of rock engaged, volume of rock removed by the cutter, length of cut, arc length of engagement, torque, energy, power, work, temperature, friction, rock hardness, rock abrasiveness, rock porosity, rock compressive strength, rock uniformity, and any combination thereof. Optionally, the wear representation of the drill bit is based, at least in part, on the drill bit characteristic. Optionally, the wear representation is a two-dimensional visual representation.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A method, comprising:
   receiving at a processor of an information handling system a drill bit characteristic related to a plurality of primary cutters to be placed on a primary blade;
   generating an output of the drill bit based, at least in part, on the drill bit characteristic, the output including a plurality of areas of one of the primary cutters including an area of max wear offset from a centerline of the one of the primary cutters;
   determining a placement of a secondary cutter including a radial position that is offset from the centerline of the one of the primary cutters to align with the area of max wear; and
   forming the drill bit, including placing the primary cutters on the primary blade and the secondary cutter at its determined placement on the secondary blade.

2. The method of claim 1, wherein the drill bit comprises a fixed cutter drill bit and the drill bit characteristic is selected from a group consisting of: velocity of the cutter, drag loading, axial loading, radial loading, total loading, area of rock engaged, volume of rock removed by the cutter, length of cut, arc length of engagement, torque, energy, power, work, temperature, friction, rock hardness, rock abrasiveness, rock porosity, rock compressive strength, rock uniformity, and any combination thereof.

3. The method of claim 1, wherein generating the output comprises generating a wear representation, and wherein the wear representation is based, at least in part, on the drill bit characteristic.

4. The method of claim 3, wherein the wear representation comprises a two-dimensional visual representation.

5. The method of claim 3, further comprising displaying the wear representation.

6. The method of claim 3, further comprising reviewing the wear representation to determine the placement of the plurality of secondary cutters on the drill bit.

7. The method of claim 1, further comprising placing the secondary cutters on a blade other than the primary blade on which the plurality of primary cutters are located.

8. A system, comprising:
   a processor; and
   a memory device coupled to the processor, the memory device including a set of instructions that, when executed by the processor, causes the processor to:
   receive at a processor of an information handling system a drill bit characteristic related to a plurality of primary cutters to be placed on a primary blade;
   generate an output of the drill bit based, at least in part, on the drill bit characteristic, the output including a plurality of areas of one of the primary cutters including an area of max wear offset from a centerline of the one of the primary cutters;
   determine, based on the output or a display of the output, a placement of a secondary cutter including a radial position that is offset from the centerline of the one of the primary cutters to align with the area of max wear; and
   using the output to guide a placement of the secondary cutter with respect to the one of the primary cutters on the drill bit to reduce cutter wear and cutter loading.

9. The system of claim 8, wherein the drill bit comprises a fixed cutter drill bit and the drill bit characteristic is selected from a group consisting of: velocity of the cutter, drag loading, axial loading, radial loading, total loading, area of rock engaged, volume of rock removed by the cutter, length of cut, arc length of engagement, torque, energy, power, work, temperature, friction, rock hardness, rock abrasiveness, rock porosity, rock compressive strength, rock uniformity, and any combination thereof.

10. The system of claim 8, wherein the set of instructions, when executed by the processor, further causes the processor to generate a wear representation of the drill bit is based, at least in part, on the drill bit characteristic.

11. The system of claim 10, wherein the wear representation comprises a two-dimensional visual representation.

12. The system of claim 10, further comprising displaying the wear representation.

13. The system of claim 8, wherein the secondary cutter is one of a plurality of secondary cutters, and wherein the set of instructions, when executed by the processor, determine the placement of a plurality of the plurality of secondary cutters on the drill bit.

14. The system of claim 13, wherein the set of instructions, when executed by the processor, determine the placement of the plurality of the plurality of secondary cutters on a blade other than the primary blade on which the plurality of primary cutters are located.

15. A bit design method, comprising:
receiving at a processor of an information handling system a drill bit characteristic related to a plurality of primary cutters to be placed on a primary blade;
generating an output of the drill bit based, at least in part, on the drill bit characteristic, the output including a plurality of areas of one of the primary cutters including an area of max wear offset from a centerline of the one of the primary cutters;
determining, based on the output or a display of the output, a placement of a secondary cutter on a secondary blade, including a radial position that is offset from the centerline of the one of the primary cutters to align with the area of max wear; and
using the output to guide a placement of the secondary cutter with respect to the at least one of the primary cutters on the drill bit to reduce cutter wear and cutter loading.

16. The bit design method of claim 15, wherein the drill bit comprises a fixed cutter drill bit and the drill bit characteristic is selected from a group consisting of: velocity of the cutter, drag loading, axial loading, radial loading, total loading, area of rock engaged, volume of rock removed by the cutter, length of cut, arc length of engagement, torque, energy, power, work, temperature, friction, rock hardness, rock abrasiveness, rock porosity, rock compressive strength, rock uniformity, and any combination thereof.

17. The bit design method of claim 15, wherein the set of instructions, when executed by the processor, further causes the processor to generate a wear representation of the drill bit is based, at least in part, on the drill bit characteristic.

18. The bit design method of claim 17, wherein the wear representation comprises a two-dimensional visual representation.

19. The bit design method of claim 17, further comprising displaying the wear representation.

20. The bit design method of claim 15, wherein the secondary cutter is one of a plurality of secondary cutters, and wherein the set of instructions, when executed by the processor, determine the placement of a plurality of the plurality of secondary cutters on the drill bit.

* * * * *